United States Patent
Kim et al.

(10) Patent No.: US 8,129,765 B2
(45) Date of Patent: Mar. 6, 2012

(54) CMOS IMAGE SENSOR WITH PHOTO-DETECTOR PROTECTING LAYERS

(75) Inventors: Ui-Sik Kim, Seongnam-si (KR); Young-Hoon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 257 days.

(21) Appl. No.: 12/214,666

(22) Filed: Jun. 20, 2008

(65) Prior Publication Data

US 2009/0014763 A1 Jan. 15, 2009

(30) Foreign Application Priority Data

Jul. 13, 2007 (KR) .................. 10-2007-0070776

(51) Int. Cl.
*H01L 27/146* (2006.01)

(52) U.S. Cl. ... 257/292; 257/72; 257/291; 257/E27.133; 438/48; 438/57

(58) Field of Classification Search .............. 257/292, 257/291, E27.133, 72; 438/48, 57
See application file for complete search history.

(56) References Cited

U.S. PATENT DOCUMENTS

| | | | | |
|---|---|---|---|---|
| 7,129,532 B2 * | 10/2006 | Lee | ............................... | 257/228 |
| 7,371,599 B2 * | 5/2008 | Sze | .................................. | 438/48 |
| 2006/0121640 A1 * | 6/2006 | Kim | .................................. | 438/57 |
| 2006/0201546 A1 * | 9/2006 | Yokoyama | ...................... | 136/263 |
| 2006/0220152 A1 * | 10/2006 | Huang et al. | .................... | 257/408 |
| 2007/0023802 A1 * | 2/2007 | Oh et al. | ......................... | 257/292 |
| 2007/0296005 A1 * | 12/2007 | Bui et al. | ........................ | 257/292 |
| 2008/0038865 A1 * | 2/2008 | Kwon | .............................. | 438/73 |

OTHER PUBLICATIONS

Korean Patent Application No. 1020030025165 to Park et al., having Publication date of Dec. 31, 2003 (w/ English Abstract page).
Korean Patent Application No. 1020040049128 to Choi, having Publication date of Jan. 6, 2006 (w/ English Abstract page).
Japanese Patent Application No. 2003-408343 to Rainer, having Publication date of Jun. 30, 2005 (w/ English Abstract page).

* cited by examiner

*Primary Examiner* — Lynne Gurley
*Assistant Examiner* — Naima Kearney
(74) *Attorney, Agent, or Firm* — Monica H. Choi

(57) ABSTRACT

An image sensor includes a logic region and an APS region having a first gate electrode, a photo-detector, a first protecting layer, first spacers, and a second protecting layer. The first gate electrode is formed over a semiconductor substrate. The photo-detector is formed to a side of the first gate electrode within the semiconductor substrate. The first protecting layer is formed over the first gate electrode and the photo-detector. The first spacers are formed over the first protecting layer to the sides of the first gate electrode. The second protecting layer is formed over the first protecting layer and the spacers. The first and second protecting layers are for preventing a contaminant from reaching the photo-detector.

18 Claims, 9 Drawing Sheets

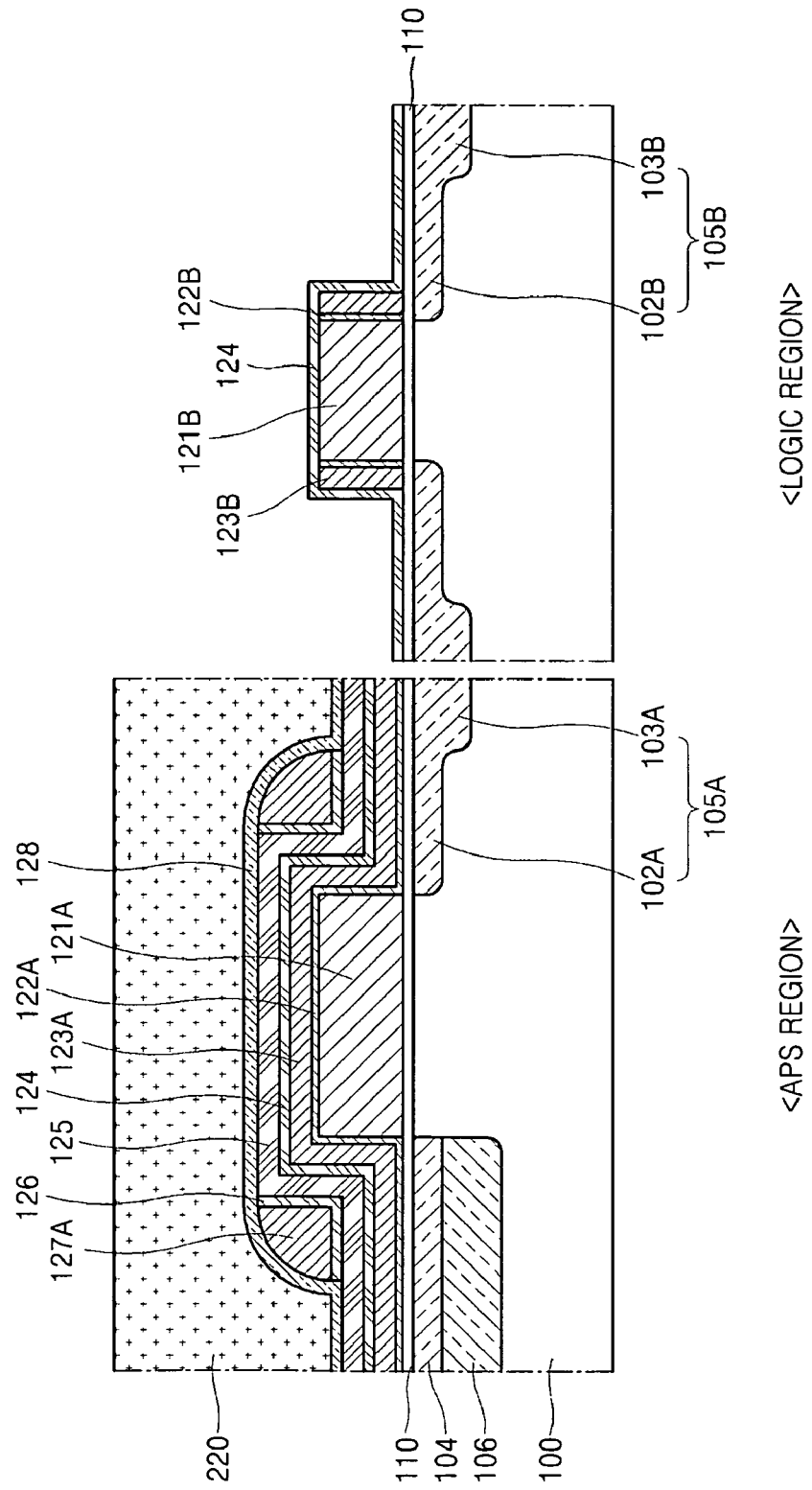

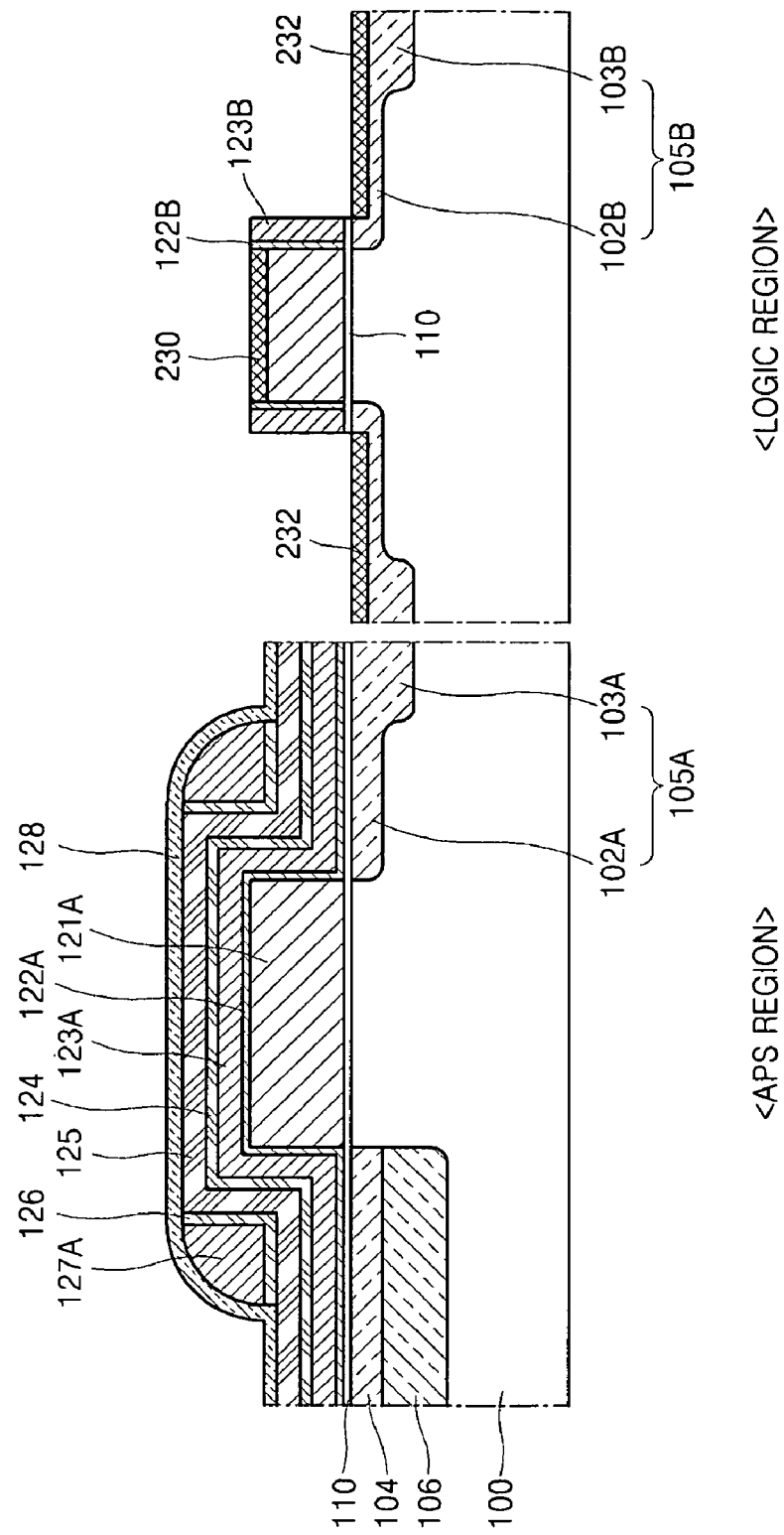

CMOS IMAGE SENSOR WITH PHOTO-DETECTOR PROTECTING LAYERS

This application claims priority under 35 USC §119 to Korean Patent Application No. 10-2007-0070776, filed on Jul. 13, 2007 in the Korean Intellectual Property Office, the disclosure of which is incorporated herein in its entirety by reference.

BACKGROUND OF THE INVENTION

1. Field of the Invention

The present invention relates generally to image sensors, and more particularly to a CMOS image sensor with multiple protecting layers for preventing contamination of a photodiode that is an example photo-detector.

2. Background of the Invention

An image sensor is a semiconductor device for converting an optical signal into electric signals. Such an image sensor is categorized as a CCD (Charge Coupled Device) or a CMOS (complementary metal-oxide conductor) image sensor (CIS). CCDs and CMOS image sensors similarly use a photodiode for converting light into electric charge, but have different mechanisms for transferring the produced electric charge.

For example, the CCD generates a final digital signal by directly transferring the generated electric charge to an amplifier using a quantum well. In contrast, the CMOS image sensor transfers the generated electric charge by converting such electric charge into an analog signal such as a current or a voltage. The CCD is also called a "passive pixel sensor," and the CMOS image sensor is also called an "active pixel sensor (APS)".

CCDs have been widely used as high-quality image sensors having charge accumulation with high sensitivity. However, CCDs have high power consumption, and have difficulty in speeding up input optical data and in integrating peripheral circuits into a one-chip system.

A CMOS image sensor with a simpler circuit structure is more easily integrated into a one-chip system that is easily manufactured into a large image sensor system. In addition, the CMOS image sensor has low power consumption and high operating speed, and is inexpensive. However, since a photodiode of each unit pixel has a respective amplifier in the CMOS image sensor, each unit pixel may generate different signals for a same input light resulting in random noise.

FIG. 1 shows a circuit diagram of an active unit pixel of a conventional CMOS image sensor. Referring to FIG. 1, the unit pixel includes a photodiode PD, a transfer transistor TX, a reset transistor RX, a drive transistor DX, and a select transistor SX. Each of such transistors TX, RX, DX, and SX is a MOSFET (metal oxide semiconductor field effect transistor) for example.

The photodiode PD produces an electric charge in response to input light, and the transfer transistor TX is controlled to transfer such electric charge from the photodiode PD to a floating diffusion region FD. The reset transistor RX is controlled to periodically reset the floating diffusion region FD. The drive transistor DX and the select transistor SX are connected in series to form a source follower for buffering a signal corresponding to the electric charge stored at the floating diffusion region FD.

FIG. 2 shows a cross-sectional view of the photodiode PD and the transfer transistor TX of the conventional CMOS image sensor of FIG. 1. Referring to FIG. 2, the transfer transistor TX includes a gate structure 25 comprised of a gate electrode 22, spacers 24, and a spacer liner 23. The transfer transistor TX also includes a source/drain region 12 formed to a side of the gate electrode 22 within a semiconductor substrate 10. A gate oxide layer 21 is formed on the semiconductor substrate 10 under the gate structure 25 and over the photodiode PD.

The photodiode PD is formed at the other side of the gate electrode 22 within the semiconductor substrate 10. The photodiode PD includes a bottom diffusion region 14 having an opposite conductivity type as the source/drain region 12. The photodiode PD also includes a top diffusion region 16 having the same conductivity type as the source/drain region 12.

The photodiode PD receives light for generating an amount of electric charge corresponding to the intensity of such received light. Any defect of the diffusion regions 14 and 16 of the photodiode PD, such as metal contamination for example, causes current leakage in the photodiode PD resulting in image distortion such as white spots.

In addition, the conventional CMOS image sensor also includes a logic region in addition to the APS (active pixel sensor) region having an array of unit pixels. The logic region is for further processing the signals output by the unit pixels. High signal processing speed by the logic region is desired, and thus, the source/drain regions of a transistor within the logic region include metal silicide.

In that case, a photodiode protecting layer is formed over the photodiode PD for preventing metal silicide from reaching the photodiode PD in the APS region. However, such a photodiode protecting layer may be partially damaged during the fabrication process resulting in metal contamination of the photodiode PD through damaged parts of the photodiode protecting layer. Such contamination undesirably results in leakage current within the photodiode PD causing white spots in a captured image.

SUMMARY OF THE INVENTION

Accordingly, a CMOS image sensor according to the present invention is formed with multiple photo-detector protecting layers for ensuring prevention of contamination of the photodiode that is an example photo-detector.

An image sensor according to an aspect of the present invention includes a logic region and an APS region having a first gate electrode, a photo-detector, a first protecting layer, first spacers, and a second protecting layer. The first gate electrode is formed over a semiconductor substrate. The photo-detector is formed to a side of the first gate electrode within the semiconductor substrate. The first protecting layer is formed over the first gate electrode and the photo-detector. The first spacers are formed over the first protecting layer to the sides of the first gate electrode. The second protecting layer is formed over the first protecting layer and the spacers. The first and second protecting layers are for preventing a contaminant from reaching the photo-detector.

For example, the first and second protecting layers are comprised of a nitride that is substantially impervious to diffusion of a metal used for forming a metal silicide in the logic region. In that case, the spacers are also comprised of a nitride.

In another embodiment of the present invention, the APS region further includes an etch stop layer disposed between the spacers and the first protecting layer. For example, the etch stop layer is comprised of an oxide.

In a further embodiment of the present invention, the first gate electrode is for a transfer transistor of the photo-detector. In that case, the APS region further includes a source/drain region formed to another side of the first gate electrode within the semiconductor substrate. For example, such a source/drain region includes a shallow region and a deep region. The shallow region is formed to the other side of the first gate electrode within the semiconductor substrate. The deep region extends from the shallow region within the semiconductor substrate. The source/drain region is of a first conductivity type.

In another embodiment of the present invention, the photo-detector is a photodiode that includes a bottom region of a second conductivity type that is opposite of the first conductivity type. In that case, the photodiode also includes a top region of the first conductivity type. The top region is formed on the bottom region, and the semiconductor substrate is of the second conductivity type.

In a further embodiment of the present invention, the APS region further includes at least one insulating layer disposed between the gate electrode and the first protecting layer. For example, the at least one insulating layer includes three oxide layers disposed between the gate electrode and the first protecting layer that is comprised of a nitride.

In addition, the APS region further includes at least one insulating layer disposed between the photo-detector and the first protecting layer. For example, the at least one insulating layer includes four oxide layers disposed between the photo-detector and the first protecting layer that is comprised of a nitride. One of the four oxide layers is a gate insulating layer disposed between the first gate electrode and the semiconductor substrate.

In another embodiment of the present invention, the second protecting layer is formed directly onto the first protecting layer over at least a portion of the photo-detector. In addition, the second protecting layer is formed directly onto the spacers. The first and second protecting layers and the spacers are each comprised of a respective nitride.

In a further embodiment of the present invention, the logic region includes a second gate electrode, second spacers, drain/source regions, a gate silicide, and drain/source silicides. The second gate electrode is formed over the semiconductor substrate. The second spacers are formed toward sidewalls of the second gate electrode. The drain/source regions are formed to sides of the second gate electrode within the semiconductor substrate. The gate silicide is formed on the second gate electrode, and the drain/source silicides are formed on the drain/source regions. The first and second protecting layers are not in the logic region.

In this manner, the second protecting layer is formed onto the first protecting layer in case of any damage to the first protecting layer during formation of the first spacers in the APS region. For example, the second protecting layer may fill and/or cover any pits or under-cuts formed in the first protecting layer during fabrication of the first spacers in the APS region.

Such first and second protecting layers ensure that metal contaminants do not reach the photo-detector during formation of metal silicide in the logic region. The first and second protecting layers are removed from just the logic region with the first and second protecting layers remaining in the APS region during formation of metal silicide in the logic region.

Such first and second protecting layers may be advantageously used for forming a CMOS (complementary metal oxide semiconductor) image sensor. However, the present invention may also advantageously be practiced with other types of image sensors.

BRIEF DESCRIPTION OF THE DRAWINGS

The above and other features and advantages of the present invention will become more apparent when described in detailed exemplary embodiments thereof with reference to the attached drawings in which:

FIGS. 3A, 3B, 3C, 3D, 3E, 3F, 3G, and 3H show cross-sectional views of a photo-diode and a transfer transistor with multiple photodiode protecting layers during fabrication of a CMOS image sensor according to an embodiment of the present invention.

The figures referred to herein are drawn for clarity of illustration and are not necessarily drawn to scale. Elements having the same reference number in FIGS. 1, 2, 3A, 3B, 3C, 3D, 3E, 3F, 3G, and 3H refer to elements having similar structure and/or function.

DETAILED DESCRIPTION OF THE INVENTION

Figure 1:
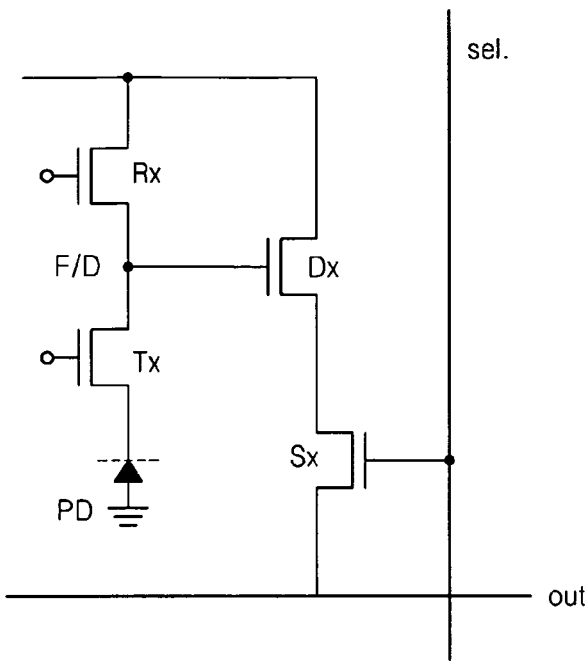
FIG. 1 shows a circuit diagram of a unit pixel of a conventional CMOS image sensor.
Figure 2:
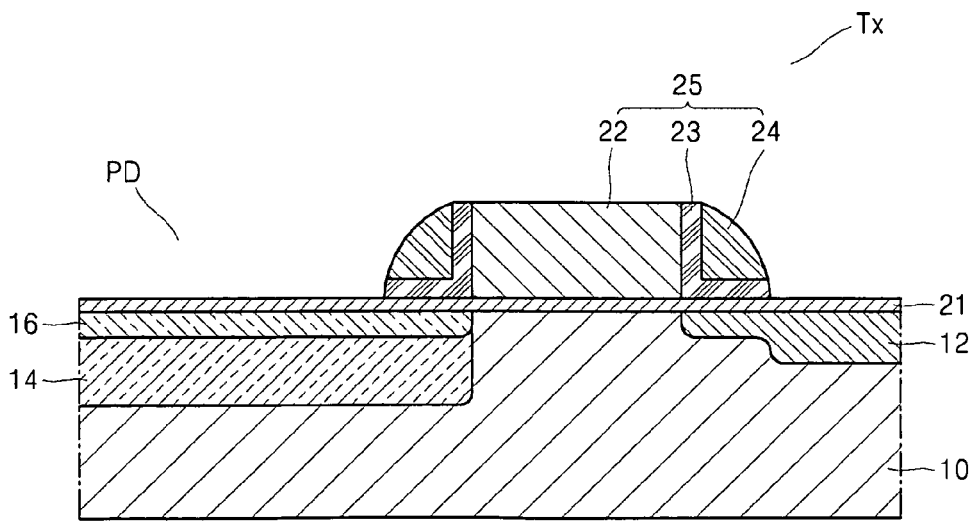
FIG. 2 shows a cross-sectional view of a photodiode and a transfer transistor in the conventional CMOS image sensor of FIG. 1.

The present invention is now described more fully with reference to the accompanying drawings, in which exemplary embodiments of the invention are shown. However, such embodiments are not intended to limit the scope of the present invention that may be implemented in other forms. The embodiments as described herein are for thoroughly and completely disclosing the present invention to those of ordinary skill in the art. The dimensions of any layers and regions in the drawings may be exaggerated for clarity of illustration.

FIGS. 3A, 3B, 3C, 3D, 3E, 3F, 3G, and 3H show cross-sectional views of an APS (active pixel sensor) region and a logic region during fabrication of a CMOS image sensor according to an embodiment of the present invention. In particular, such FIGS. 3A, 3B, 3C, 3D, 3E, 3F, 3G, and 3H illustrate a photo-diode and a transfer transistor of an example unit pixel formed in the APS region with multiple photodiode protecting layers and an example field effect transistor formed in the logic region.

The APS region has an array of pixel units formed thereon for sensing light of an image. The logic region has additional circuitry for processing the electrical signals generated from such an array of pixel units. An example field effect transistor of such circuitry is illustrated in the logic region of FIGS. 3A, 3B, 3C, 3D, 3E, 3F, 3G, and 3H.

Figure 3A:
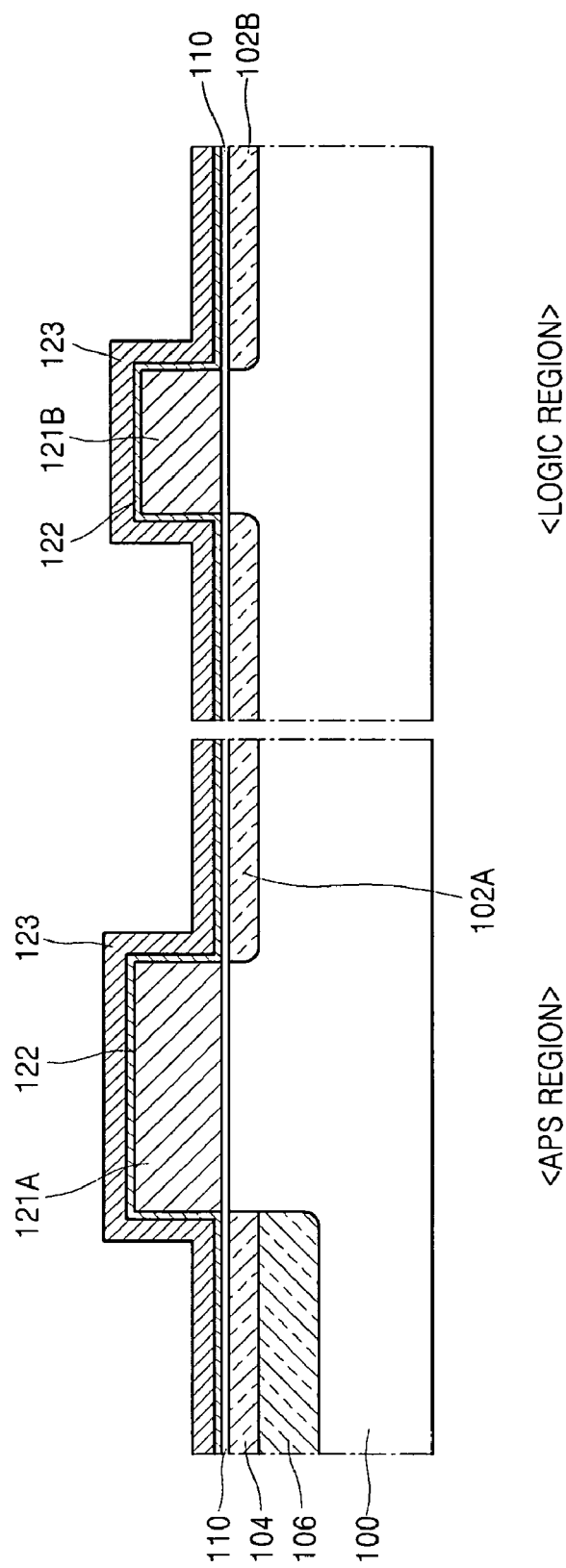

Referring to FIG. 3A, a gate oxide layer (i.e., a gate insulating layer) 110 is formed on a semiconductor substrate 100 which may be a silicon substrate for example. In addition, a first gate electrode 121A is formed on a portion of the gate oxide layer 110 over the semiconductor substrate 100 in the APS region. A second gate electrode 121B is formed on a portion of the gate oxide layer 110 over the semiconductor substrate 100 in the logic region. The first and second gate electrodes 121A and 121B are each comprised of polysilicon in an example embodiment of the present invention.

The first gate electrode 121A is for forming a transfer transistor of the unit pixel having the photodiode 104 and 106 in the APS region. The second gate electrode 121B is for forming an example field effect transistor of circuitry in the logic region for further processing electrical signals from the array of unit pixels of the APS region.

Further referring to FIG. 3A, the photodiode including the junction regions 104 and 106 is formed to one side of the first gate electrode 121A within the semiconductor substrate 100. The photodiode includes the bottom junction region 106 having a P-type conductivity with higher dopant concentration than the semiconductor substrate 100 that is also of P-type conductivity. The photodiode further includes the top junction region 104 having an N-type conductivity formed on the bottom junction region 106.

In addition in FIG. 3A, a shallow junction region 102A is formed to another side of the first gate electrode 121A within the semiconductor substrate 100 for forming a drain/source region of the transfer transistor. The drain/source region 102A is of N-type conductivity.

Also referring to the logic region of FIG. 3A, shallow drain/source regions 102B are formed to sides of the second gate electrode 121B within the semiconductor substrate. The shallow drain/source regions 102B are of N-type conductivity.

Also in FIG. 3A, a spacer oxide layer 123 is formed on the first oxide layer 122. The spacer oxide layer 123 is comprised of LP-TEOS (low-pressure tetraethyl orthosilicate), which is an MTO (moderate temperature oxide), having a thickness of about 120 Å, according to an example embodiment of the present invention.

Also in FIG. 3A, a spacer oxide layer 123 is formed on the first oxide layer 122. The spacer oxide layer 123 is comprised of LP-TEOS (low-pressure tetraethyl orthosilicate), which is an MTO (moderate temperature oxide), having a thickness of about 120☐, according to an example embodiment of the present invention.

Figure 3B:
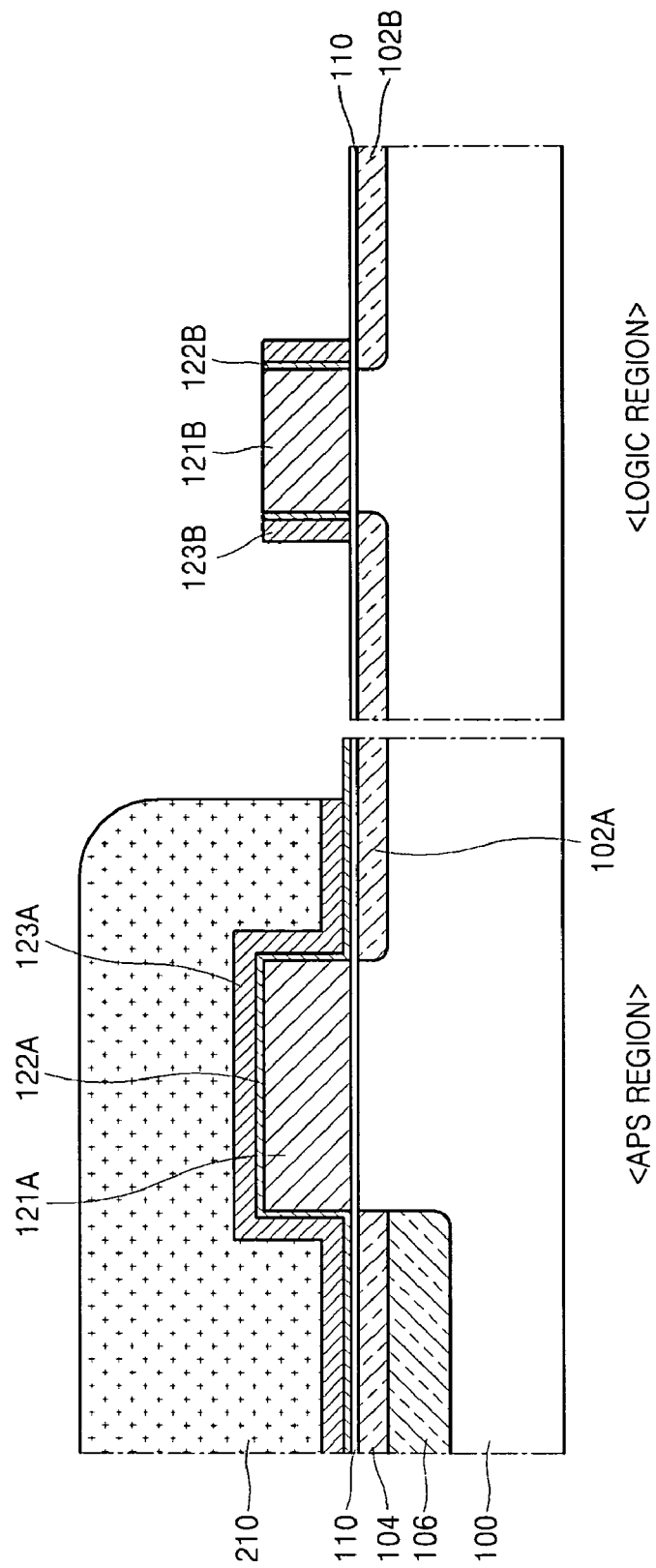

Thereafter referring to FIG. 3B, a photoresist 210 is patterned to cover the APS region. Also in FIG. 3B, exposed portions of the spacer oxide layer 123 in the logic region are anisotropically etched away to form oxide spacers 123B at the sidewalls of the second gate electrode 121B. In addition, exposed portions of the first oxide layer 122 may be etched away such that portions 122B of the first oxide layer 122 remain between the oxide spacers 123B and the second gate electrode 121B. A portion 123A of the spacer oxide layer 123 and a portion 122A of the first oxide layer 122 remain under the photoresist 210 in the APS region.

Subsequently referring to FIG. 3C, the photoresist 210 is removed from the APS region. In addition in FIG. 3C, a first etch stop layer 124 is deposited onto exposed surfaces of the APS region and the logic region. Thus, the first etch stop layer 124 is deposited on exposed surfaces of the remaining spacer oxide layer portion 123A in the APS region and on exposed surfaces of the gate oxide layer 110, the oxide spacers 123B, and the second gate electrode 121B in the logic region. The first etch stop layer 124 is comprised of an oxide such as LT-USG (low-temperature undoped silicate glass) with a thickness of about 50 Å, in an example embodiment of the present invention.

Figure 3C:
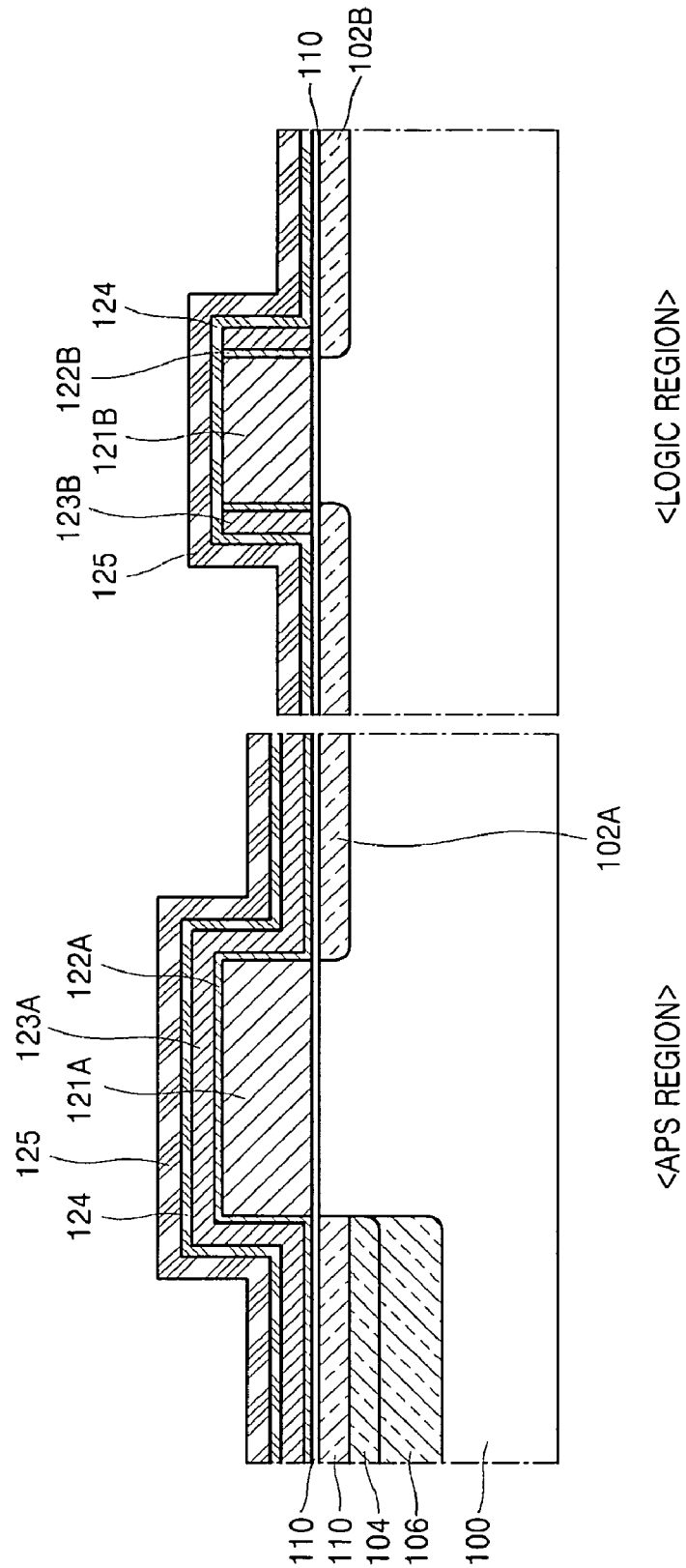

Also referring to FIG. 3C, a first photodiode protecting layer 125 is formed on the first etch stop layer 124. The first photodiode protecting layer 125 which is also termed a SBL (silicide blocking layer) is comprised of a nitride having a thickness of about 100 Å in an example embodiment of the present invention. The first etch stop layer 124 acts as an etch stop during etching of the first photodiode protecting layer 125 from the logic region (to be described later herein).

Figure 3D:
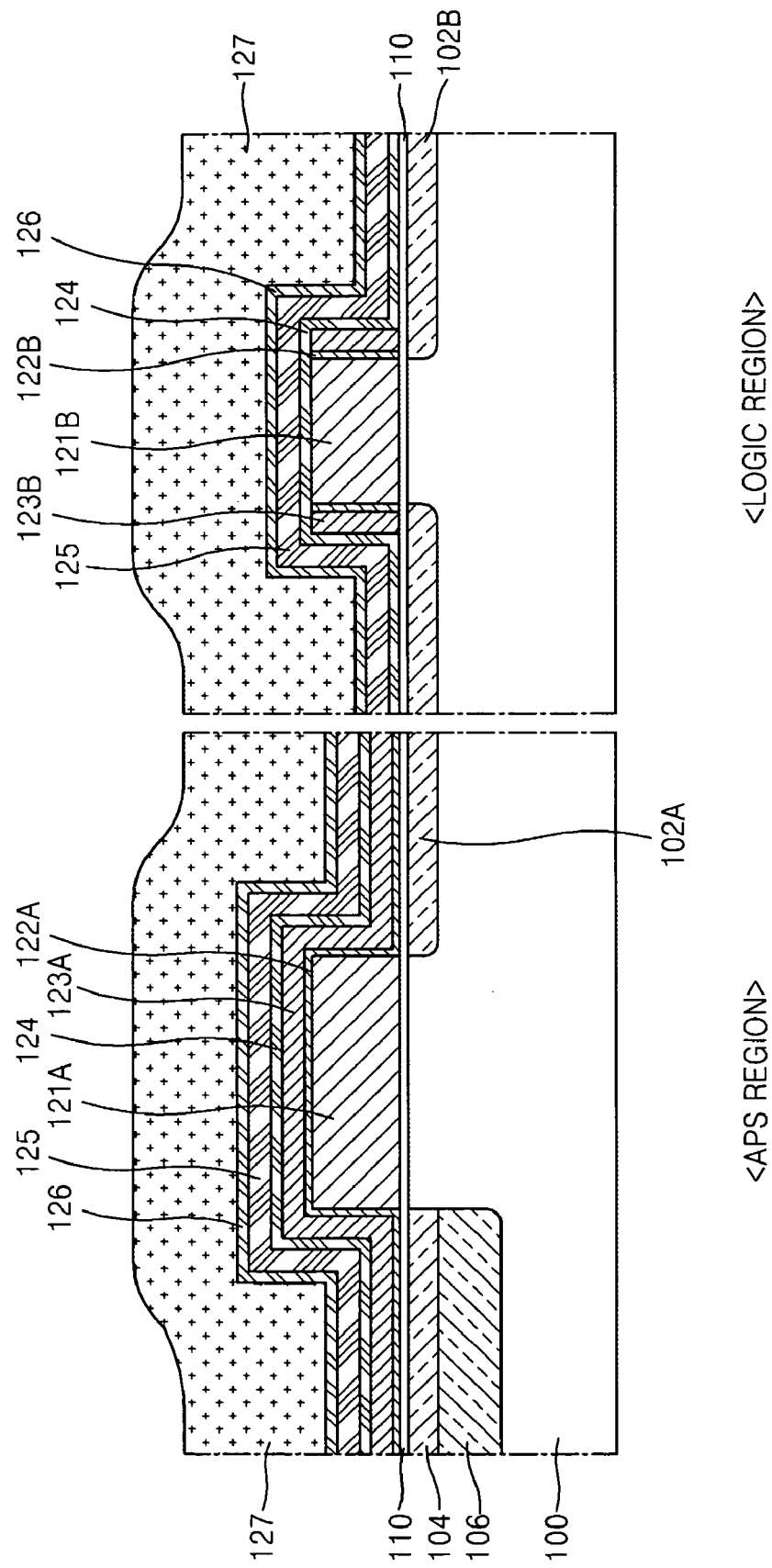

Thereafter referring to FIG. 3D, a second etch stop layer 126 is formed on the first photodiode protecting layer 125. The second etch stop layer 126, similar to the first etch stop layer 124, is comprised of an oxide such as LT-USG (low-temperature undoped silicate glass) with a thickness of about 130 Å in an example embodiment of the present invention. Also in FIG. 3D, a nitride spacer layer 127 is deposited on the second etch stop layer 126. The nitride spacer layer 127 is comprised of a nitride in an example embodiment of the present invention.

Subsequently referring to FIG. 3E, the nitride spacer layer 127 is anisotropically etched such that nitride spacers 127A and 127B are formed to the sidewalls of the first and second gate electrodes 121A and 121B, respectively, in the APS region and the logic region. The second etch stop layer 126 acts as an etch stop during such etching of the nitride spacer layer 127 for forming the spacers 127A and 127B. Thus, portions of the second etch stop layer 126 remain between the nitride spacers 127A and the first photodiode protecting layer 125 in the APS region, and between the nitride spacers 127B and the first photodiode protecting layer 125 in the logic region.

Figure 3E:
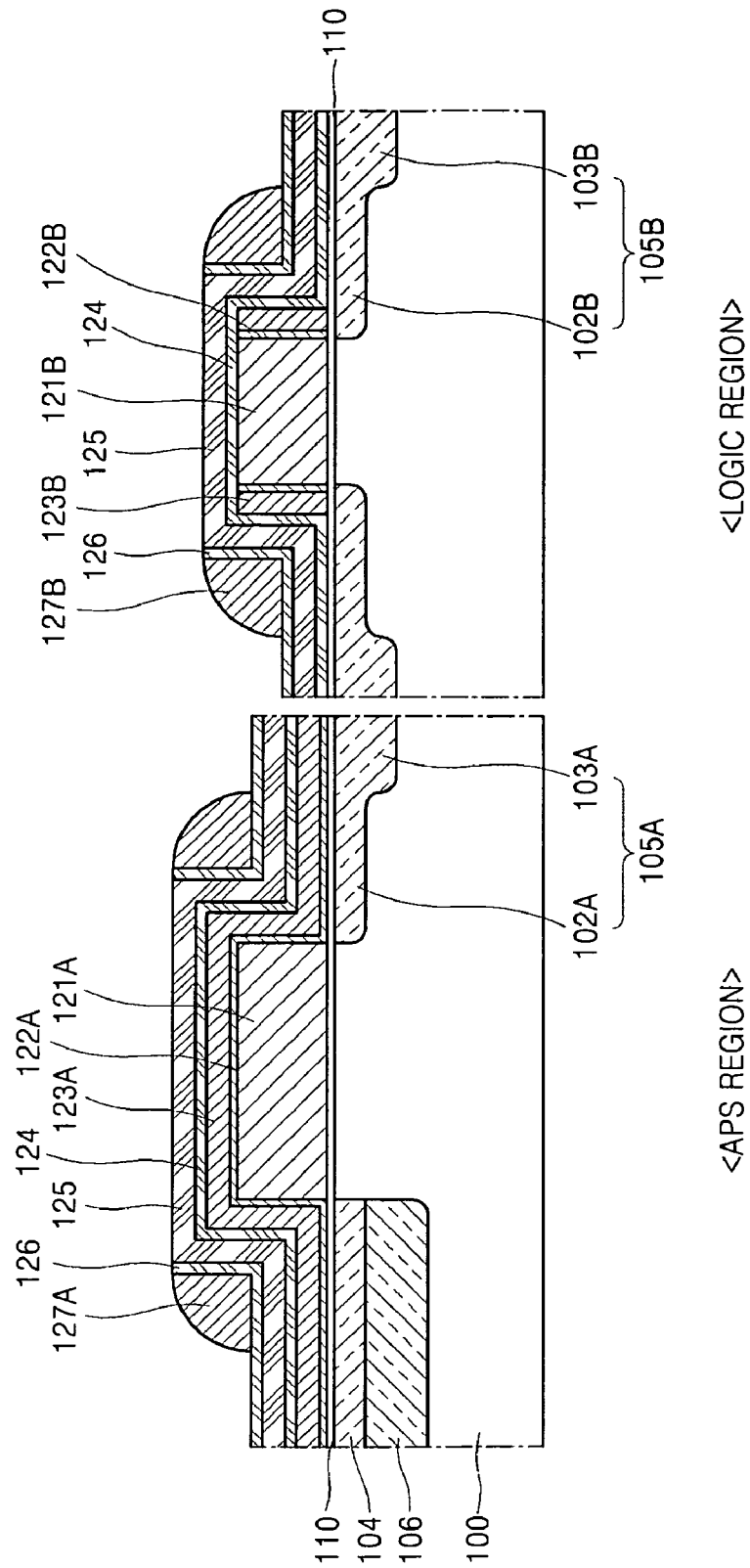

Further referring to FIG. 3E, an N-type dopant is implanted into portions of the semiconductor substrate 100 extending from the nitride spacers 127A and 127B to form deep junction regions 103A and 103B extending from the shallow junction regions 102A and 102B after the nitride spacers 127A and 127B are formed. The shallow and deep junction regions 102A and 103 form a drain/source region 105A of the transfer transistor in the APS region. Similarly, deep junction regions 103B are formed to extend from the shallow junction regions 102B to form the drain/source regions 105B of the field effect transistor in the logic region.

Figure 3F:
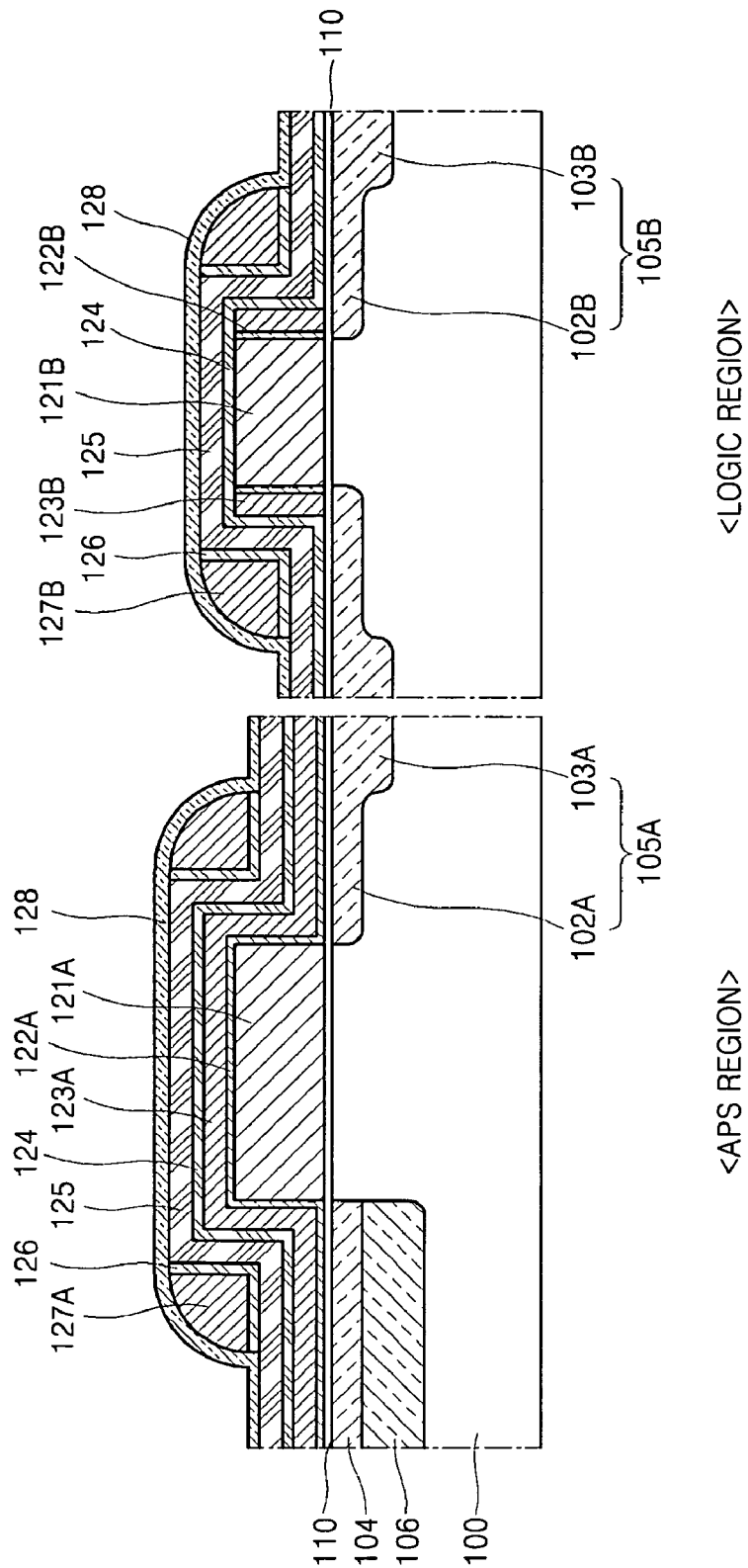

Also referring to FIGS. 3E and 3F, during subsequent cleaning processes, exposed portions of the second etch stop layer 126 are etched away such that only portions of the second etch stop layer 126 between the nitride spacers 127A and 127B and the first photodiode protecting layer 125 remain. Thus, portions of the first photodiode protecting layer 125 not under the nitride spacers 127A and 127B are exposed. The first photodiode protecting layer 125 may become damaged with pits and/or under-cuts formed therein during etching of the nitride spacer layer 127 to form the nitride spacers 127A and 127B.

Accordingly referring to FIG. 3F, a second photodiode protecting layer 128 is deposited on exposed surfaces in the APS region and the logic region after the nitride spacers 127A and 127B are formed. Thus in FIG. 3F, the second photodiode protecting layer 128 is formed directly onto the first photodiode protecting layer 125 and directly onto the nitride spacers 127A and 127B. In particular, the second photodiode protecting layer 128 is formed directly onto the first photodiode protecting layer 125 over at least a portion of the photodiode 104 and 106.

The second photodiode protecting layer 128 is comprised of a nitride having a thickness of about 100 Å or less, according to an embodiment of the present invention. In this manner, the second photodiode protecting layer 128 may fill in and compensate for any pit and/or any undercut that may have formed within the first photodiode protecting layer 125 during the etching of the nitride spacer layer 127 to form the nitride spacers 127A and 127B and/or in the following cleaning process.

Note that a first set of multiple insulating layers 110, 122A, 123A, 124, 125, and 128 are formed over at least a portion of the photodiode 104 and 106. Similarly, a second set of multiple insulating layers 122A, 123A, 124, 125, and 128 are formed over the first gate electrode 121A.

Thereafter referring to FIG. 3G, while the APS region is covered with photoresist 220, the second photodiode protecting layer 128, the nitride spacers 127B, remaining portions of the second etch stop layer 126, and the first photodiode protecting layer 125 in the logic region are etched away using the first etch stop layer 124 as an etch stop. Thus in FIG. 3G, the first etch stop layer 124 becomes exposed in the logic region.

Subsequently referring to FIG. 3H, the first etch stop layer 124 and exposed portions of the gate oxide layer 110 over the drain/source regions 105B in the logic region are etched away such as during a subsequent cleaning process. Thus, the second gate electrode 121A and the drain/source regions 105B in the logic region become exposed. A metal is deposited thereon and heated such that a gate silicide 230 is formed on the second gate electrode 121B, and drain/source silicides 232 are formed on the drain/source regions 105B, in the logic region.

During formation of such metal suicides 230 and 232 in the logic region, the first and second photodiode protecting layers 125 and 128 remain over the APS region. The first and second photodiode protecting layers 125 and 128 are comprised of respective material such as a nitride that are impervious to diffusion of metal to the photodiode 104 and 106 and the first gate electrode 121A. Thus, contamination of the photodiode 104 and 106 and the first gate electrode 121A in the APS region is minimized to prevent formation of a metal silicide and leakage current therein. In particular, the second photodiode protecting layer 128 compensates for damage in the first photodiode protecting layer 125 especially over the photodiode 104 and 106 and the first gate electrode 121A in the APS region.

While the present invention has been particularly shown and described with reference to an exemplary embodiment thereof, it will be understood by those of ordinary skill in the art that various changes in form and details may be made therein without departing from the spirit and scope of the present invention as defined by the following claims.

For example, the present invention has been described for the photodiode 104 and 106 that is just an example photodetector device. However, the present invention may be practiced with any type of photo-conversion device that generates electric charge from received light, herein broadly termed a photo-detector.

The present invention is limited only as defined in the following claims and equivalents thereof.

What is claimed is:

1. An image sensor comprising:
a logic region; and
an APS region including:
a first gate electrode formed entirely in the APS region over a semiconductor substrate;
a photo-detector formed to a first side of the first gate electrode within the semiconductor substrate;
a first drain/source region formed to a second side of the first gate electrode within the semiconductor substrate;
a first protecting layer formed over the first gate electrode, the photo-detector, and the first drain/source region;
first spacers formed over the first protecting layer to the sides of the first gate electrode; and
a second protecting layer formed over the first protecting layer and the spacers,
wherein the first and second protecting layers prevent a contaminant from reaching the photo-detector,
and wherein the first and second protecting layers are formed over the first gate electrode and the first drain/source region to prevent formation of silicide on any portion of the first gate electrode and on any portion of said first drain/source region,
and wherein the logic region includes:
a second gate electrode formed over the semiconductor substrate;
second spacers formed toward sidewalls of the second gate electrode;
second drain/source regions formed to sides of the second gate electrode within the semiconductor substrate;
a gate silicide formed on the second gate electrode; and
drain/source silicides formed on the second drain/source regions,
wherein the first and second protecting layers are not in the logic region.

2. The image sensor of claim 1, wherein the first and second protecting layers are comprised of a nitride that is substantially impervious to diffusion of a metal used for forming a metal silicide in the logic region.

3. The image sensor of claim 2, wherein the spacers are comprised of a nitride.

4. The image sensor of claim 3, wherein the APS region further includes:
an etch stop layer disposed between the spacers and the first protecting layer.

5. The image sensor of claim 4, wherein the etch stop layer is comprised of an oxide.

6. The image sensor of claim 1, wherein the first gate electrode is for a transfer transistor of the photo-detector, and wherein an additional insulating layer is formed under the first and second protecting layers over the photo-detector, and wherein the additional insulating layer is not present over the first gate electrode.

7. The image sensor of claim 1, wherein the first source/drain region includes:
a shallow region formed to said second side of the first gate electrode within the semiconductor substrate; and
a deep region extending from the shallow region within the semiconductor substrate.

8. The image sensor of claim 1, wherein the first source/drain region and the second drain/source regions are of a first conductivity type, and wherein the photo-detector is a photodiode that includes:
a bottom region of a second conductivity type that is opposite to the first conductivity type; and
a top region of the first conductivity type, with the top region formed on the bottom region,
wherein the semiconductor substrate is of the second conductivity type.

9. The image sensor of claim 1, wherein the APS region further includes:
at least one insulating layer disposed between the first gate electrode and the first protecting layer.

10. The image sensor of claim 9, wherein the at least one insulating layer includes three oxide layers disposed between the first gate electrode and the first protecting layer that is comprised of a nitride.

11. The image sensor of claim 1, wherein the APS region further includes:
at least one insulating layer disposed between the photo-detector and the first protecting layer.

12. The image sensor of claim 11, wherein the at least one insulating layer includes four oxide layers disposed between the photo-detector and the first protecting layer that is comprised of a nitride.

13. The image sensor of claim 1, wherein the second protecting layer is formed directly onto the first protecting layer over at least a portion of the photo-detector.

14. The image sensor of claim 13, wherein the second protecting layer is formed directly onto the spacers.

15. The image sensor of claim 13, wherein the first and second protecting layers are each comprised of a respective nitride.

16. The image sensor of claim 15, wherein the APS region further includes:
four oxide layers disposed between the photo-detector and the first protecting layer.

17. The image sensor of claim 16, wherein one of the four oxide layers is a gate insulating layer disposed between the first gate electrode and the semiconductor substrate.

18. The image sensor of claim 1, wherein the image sensor is a CMOS (complementary metal oxide semiconductor) image sensor.

* * * * *